(12) United States Patent
Lucas et al.

(10) Patent No.: US 6,294,820 B1
(45) Date of Patent: Sep. 25, 2001

(54) METALLIC OXIDE GATE ELECTRODE STACK HAVING A METALLIC GATE DIELECTRIC METALLIC GATE ELECTRODE AND A METALLIC ARC LAYER

(75) Inventors: Kevin Lucas; Olubunmi Adetutu; Christopher C. Hobbs, all of Austin; Yolanda Musgrove, Pflugerville; Yeong-Jyh Tom Lii, Austin, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/420,600

(22) Filed: Oct. 19, 1999

Related U.S. Application Data

(62) Division of application No. 09/028,101, filed on Feb. 23, 1998, now Pat. No. 6,004,850.

(51) Int. Cl.$^7$ ................ H01L 21/3205; H01L 21/4763; H01L 31/062
(52) U.S. Cl. .................... 257/412; 438/240; 438/636; 438/608; 257/410
(58) Field of Search .................... 438/244, 240, 438/636, 635, 608, 592, 585; 257/412, 411, 761, 410

(56) References Cited

U.S. PATENT DOCUMENTS

| | | | |
|---|---|---|---|
| 4,156,622 | 5/1979 | Lindmayer | 136/89 |
| 4,201,798 | 5/1980 | Lindmayer | 427/74 |
| 4,372,987 | 2/1983 | Ganner et al. | 427/42 |
| 4,707,820 | 11/1987 | Sawamura | 369/284 |
| 5,066,615 * | 11/1991 | Brady et al. | 438/636 |
| 5,181,141 | 1/1993 | Sato et al. | 359/580 |
| 5,457,570 | 10/1995 | Lu et al. | 359/361 |
| 5,605,609 | 2/1997 | Ando et al. | 204/192.23 |
| 5,834,353 * | 11/1998 | Wu | 438/287 |
| 5,976,973 * | 11/1999 | Ohira et al. | 438/636 |
| 5,985,517 * | 11/1999 | Tanaka et al. | 430/311 |

FOREIGN PATENT DOCUMENTS

| | | |
|---|---|---|
| 3026703 A1 | 1/1982 | (DE) . |
| 1415 097 | 12/1975 | (GB) . |
| 60225101 | 11/1985 | (JP) . |
| 4166901 | 6/1992 | (JP) . |
| 4191801 | 7/1992 | (JP) . |
| 5011101 | 1/1993 | (JP) . |

OTHER PUBLICATIONS

Regh, et al., "Solgel Derived Tantalum Pentoxide Films As Ultraviolet Antireflective Coatings for Silicon", Applied Optics, vol. 28, No. 24, pp. 5215–5221 (1989).

* cited by examiner

Primary Examiner—Michael Trinh
(74) Attorney, Agent, or Firm—Patricia S. Goddard; Keith E. Witek

(57) ABSTRACT

A method for forming a tantalum-based anti-reflective coating (ARC) layer begins by forming an MOS metallic gate electrode layer (20) over a substrate (20). The MOS metallic gate electrode layer (20) is covered with an ARC layer (22). The ARC layer is preferably tantalum pentoxide or a tantalum pentoxide layer doped with one or more of nitrogen atoms and/or silicon atoms. The layers (22 and 20) are then selectively masked photoresist (24) that is selectively exposed to deep ultraviolet (DUV) radiation (28). The ARC layer (22) improves lithographic critical dimension (CD) control of the MOS metallic gate during exposure. The final MOS metallic gate is then patterned and etched using a fluorine-chlorine-fluorine time-progressed reactive ion etch (RIE) process, whereby metallic-gate MOS transistors are eventually formed.

8 Claims, 3 Drawing Sheets

METALLIC OXIDE GATE ELECTRODE STACK HAVING A METALLIC GATE DIELECTRIC METALLIC GATE ELECTRODE AND A METALLIC ARC LAYER

This is a divisional based on prior U.S. patent application Ser. No. 09/028,101, filed on Feb. 23, 1998, U.S. Pat. No. 6,004,850, which is hereby incorporated by reference, and priority thereto for common subject matter is hereby claimed.

FIELD OF THE INVENTION

The present invention relates generally to semiconductor manufacturing, and more particularly to, forming a tantalum pentoxide ($Ta_2O_5$) anti-reflective coating (ARC) for use with metal oxide semiconductor (MOS) transistors having metallic gate electrodes.

BACKGROUND OF THE INVENTION

The present invention is directed to semiconductor devices in general, and more particularly, anti-reflective coating (ARCs) used within the gate stack of modem metal oxide semiconductor (MOS) transistor structures having a metallic gate electrode.

In modern semiconductor device manufacturing, a plurality of layers are generally deposited on a semiconducting substrate, that is typically made of silicon. These layers are then patterned and etched by photolithography and etch techniques to form a gate electrode stack. Generally, the gate electrode stack includes a gate dielectric overlying a substrate channel region, a polysilicon (poly) gate layer overlying the gate dielectric, and an anti-reflective coating (ARC) layer overlying the gate layer which is typically silicon nitride. Following deposition of these three basic layers (i.e., gate dielectric, gate electrode, and ARC), a photoresist layer is spun onto the substrate over the top of the ARC layer. The photoresist is then selectively exposed to light through a lithographic mask to form exposed and unexposed regions of the photoresist. The exposed photoresist regions are then developed and removed from the substrate, thereby exposing top portions of the ARC layer. The exposed portions of the ARC layer are then exposed to an etch process which removes portions of the ARC layer, then removes portions the gate layer, and/or finally removes portions of the gate dielectric. This removal defines the gate stack structure.

The ARC layer is generally deposited to prevent unwanted reflection of radiation/energy (e.g., I-line, deep ultraviolet (DUV) radiation, and G-line radiation) from the gate stack, back into the photoresist. This undesirable reflection results in unwanted exposure of some portions of the photoresist and/or lack of proper exposure of the photoresist. Improper exposure and subsequent removal of improperly-exposed portions of the photoresist negatively impact the critical dimensions (CD) of the semiconductor devices (e.g., one important CD is the gate electrode width, which is critical to MOS device performance, and may be less controllable without an ARC layer). In addition, the reflections greatly reduce the lithographic exposure latitude which is undesirable.

In order to reduce the magnitude of these problems, anti-reflective coating (ARC) layers were developed for MOS manufacturing. Several different ARC layers have typically been used in order to prevent or largely suppress unwanted reflection of the energy during photoresist exposure. ARC layers such as silicon nitride, silicon oxynitride, silicon-rich silicon nitride, and silicon-rich silicon oxynitride, have been used as an ARC layer in connection with polysilicon MOS gate structures. While such ARC layers have been largely successful in suppressing unwanted reflection in polysilicon gate structures, problems have been encountered with the use of these known ARC materials. The problems include high stress associated with the ARC layers, poor adhesion between the ARC layer and gate electrodes, and the need for high deposition temperatures which is generally undesirable in the IC industry. The relatively high stress and low adhesion of the ARC layer results in peeling or delamination of the ARC layer from the poly gate layer, which substantially impacts device yield. In an attempt to improve device yield, it is generally desirable to put an adhesive "glue" layer between the ARC layer and the polysilicon gate layer which increases process complexity, reduces wafer throughput and IC time to market, and may adversely increase gate resistance.

As modern semiconductor manufacturing moves toward use of metal gate layers rather than polysilicon gate layers, problems with efficacy and integration of silicon nitride, silicon oxynitride, and like ARC layers become even more pronounced. Indeed, it has been found that the conventional silicon nitride and silicon oxynitride groups of materials cannot adhere properly to metal gates, such as TaN, TiN, or $W_2N$, and may adversely chemically interact with the underlying polysilicon material.

Accordingly, it is quite clear that a need exists in the art for ARC layers that are more compatible with metallic MOS gates. These new ARC layers should have one or more of reduced stress levels, improved adhesion, lower deposition temperatures, as well as adequate anti-reflective properties.

Figure 1:
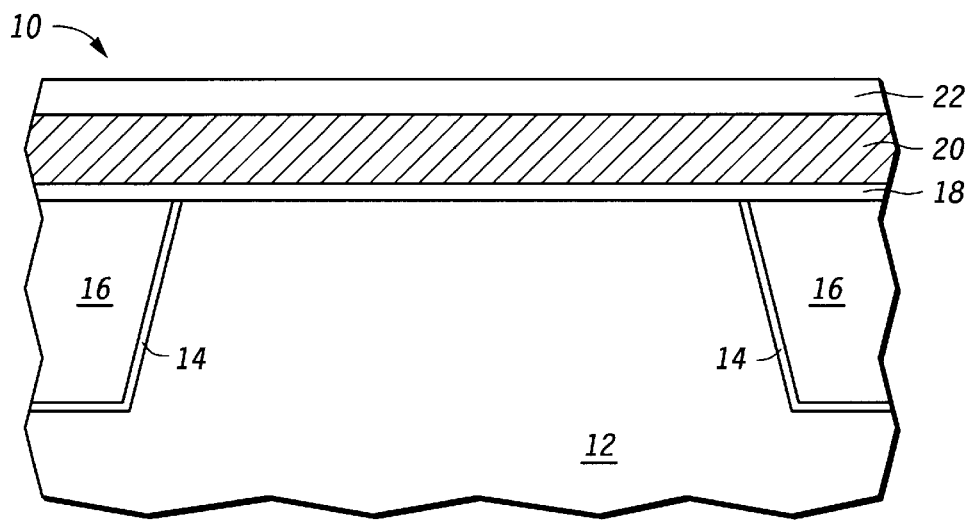
FIG. 1 illustrates a stage in the process of forming a semiconductor device according to the present invention up until an ARC layer is deposited.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF THE PREFERRED EMBODIMENT

Generally, FIGS. 1–6 herein teach a process for forming a metallic gate stack structure useful for making metallic-gate metal oxide semiconductor (MOS) transistors or metallic-gate complementary MOS (CMOS) transistor structures. The metallic gate stack is preferable formed to contain a bottom metallic gate dielectric (e.g., $TiO_2$, $Ta_2O_5$, or composites thereof), followed by an intermediate metallic conductive gate electrode (e.g., TaN), followed by a top layer of one of either a metal oxide, metal silicon oxide, metal silicon nitride, or metal silicon oxynitride anti-reflective coating (ARC) layer (e.g., $TaSi_yO_zN_t$ or $Ta_2O_5$). These stacked materials are etched to form the metallic gate stack by utilizing a fluorine-chlorine-fluorine time-serial plasma or reactive ion etch (RIE) sequence. The resulting metallic stack has a metallic dielectric layer that is improved over conventional silicon dioxide since it can be formed thicker whereby leakage current is reduced while still maintaining an equivalent $SiO_2$ thickness of roughly 10–50 Angstroms to preserve transistor performance. The tantalum-based metallic gate electrode provides improved transistor performance and has improved conductivity over conventional polysilicon gates. In addition, polysilicon gates will react with metallic oxides creating $SiO_2$ which adversely affect the overall $\epsilon$ value of the gate dielectric and affects the thickness of the gate dielectric in a manner that is difficult to control. Most importantly, the tantalum-based ARC layer provides greater adhesion to the metal gate whereby MOS yield is improved, eliminates the need for a resistive or complex glue layer, reduces gate stack stress in the integrated circuit (IC), and may be formed at lower temperatures that are more compatible with deep submicron devices (gate dimensions less than 0.25 microns).

In FIG. 1, a semiconductor device 10 is provided. Device 10 has a substrate 12. The substrate 12 may be provided as any known substrate material, such as intrinsic or compensated silicon, doped silicon, silicon-on-insulator (SOI) wafers, germanium, gallium arsenide (GaAs), silicon carbide, epitaxial regions, etc.. Device 10 contains trench isolation regions. A trench region is formed by selectively reactive ion etching (RIE) into portions of the substrate to form trench regions. These trench regions are then lined with a liner layer 14. The liner 14 is typically formed by wet and/or dry thermal oxidation whereby the liner 14 is preferably silicon dioxide ($SiO_2$) or some composite thereof. The dielectric trench fill 16 in FIG. 1 is typically formed by chemical vapor deposition (CVD) of tetraethylorthosilicate (TEOS) that is subsequently planarized by a chemical mechanical polishing (CMP) process and/or a resist etch back (REB) process. Although trench isolation (e.g., shallow trench isolation (STI)) is specifically shown in FIG. 1, the trench isolation in FIG. 1 may be replaced with other isolation schemes such as local oxidation of silicon (LOCOS), polysilicon buffer LOCOS (PBL), field shield isolation, and the like.

After formation of the shallow trench isolation in FIG. 1, a gate dielectric layer 18 is formed. Typically, the gate dielectric is formed by thermally growing silicon dioxide ($SiO_2$) either in a dry ambient, in a steam ambient, or in a partially wet thermal ambient in the IC industry. The gate dielectric is usually formed to be relatively thin (e.g., 250 Angstroms to 40 Angstroms in $SiO_2$ thickness), thereby providing improved transistor performance over thicker gate dielectrics. In other embodiments, the gate dielectric region 18 is formed as a composite dielectric material. Once such composite material is a CVD deposited TEOS layer overlying a thermally grown oxide silicon dioxide layer. Other composites combine one or more of metallic oxides, CVD silicon oxides, silicon nitride, and/or like dielectric materials to form the gate dielectric layer 18. The gate dielectric 18 may be optionally doped with one or more of nitrogen, chlorine, fluorine, or other dopants to improve dielectric properties or transistor performance.

In the preferred form shown in FIG. 1, device 10 has a metallic gate dielectric layer 18 which is more compatible with adjacent metallic regions, such as a metallic gate electrode formed from layer 20. The metallic gate dielectric layer 18 may be made of one or more of tantalum oxide or tantalum pentoxide (e.g., $Ta_2O_5$ or $Ta_xO_y$), titanium oxide ($TiO_2$), other high K dielectrics, combinations thereof, and/or the like. Metallic gate dielectrics are now being preferred in semiconductor structures since metallic dielectrics have higher dielectric constants ($\epsilon$). The higher $\epsilon$ value ensures that the metallic oxide can be formed thicker than conventional $SiO_2$ (e.g., 80 Angstroms to thousands of Angstroms in thickness) to reduce leakage current while the higher $\epsilon$ value maintains a high-performance equivalent-silicon-dioxide thickness of roughly 20 to 50 Angstroms or less.

Further, according to the present invention, a metal gate layer 20 is deposited on gate dielectric 18. The metal gate layer 20 may be formed of any one of more metallic materials, including titanium, molybdenum, tantalum, platinum, iridium, tungsten, titanium nitride (TiN), tungsten nitride (WN), other metallic nitrides, composites thereof, or the like. A tantalum or titanium based gate electrode is preferred herein. Metal gates are now preferred in the IC industry over polysilicon gates since metal gates offer greater conductivity for improved integrated circuit (IC) performance. Metal gates also do not charge deplete via depletion regions to the extent that polysilicon layers deplete, whereby the effective thickness of the gate dielectric does not change as much, if at all, with applied gate voltages. Since the gate layer 20 contains metallic atoms to serve this performance improvement purpose, it is preferable that the gate dielectric 18 formed with a metallic dielectric rather than $SiO_2$ for integration purposes a well as performance purposes. The metal gate layer 20 may be formed by chemical vapor deposition (CVD) or low power physical vapor deposition (PVD). Typically, the metal gate layer is on the order of 1000 to 4000 angstroms in thickness, although other thicknesses are possible depending upon the application.

Subsequent to formation of the metal gate layer 20, an anti-reflective coating (ARC) layer 22 is deposited. According to the present invention, the ARC layer comprises a metal oxide, such as $Ta_2O_5$, $TiO_2$. In addition, the metal oxide may also include silicon and/or nitrogen atoms, to form metal silicon oxynitride compounds ($M_xSi_yO_zN_t$) where M is any metallic atom such an tantalum (Ta). A tantalum based ARC layer 22, such as tantalum pentoxide, is preferred herein. Doping the tantalum pentoxide ARC layer 22 with silicon is optionally accomplished by exposing the ARC layer to a silicon source, such as silane, during ARC formation or shortly after ARC layer formation. Doping the tantalum pentoxide ARC layer with nitrogen is accomplished by exposing the ARC layer to a nitrogen source, such as $N_2$, NO, $N_2O$, $NH_3$, etc., during ARC formation or shortly after ARC layer formation. The ARC layer may be formed by a chemical vapor deposition (CVD) process and generally has a thickness on the order of 250 angstroms or less. The ARC layer preferably has an extinction coefficient (k) of greater than or equal to 0.2 at the lithographic exposure wavelength. In the alternative, the ARC layer may be formed by reactive ion sputtering (RIS) the metallic atoms from a sputter target through an oxygen-containing ambient to form tantalum pentoxide directly on the metallic gate 20. In yet another form, tantalum metal may be sputtered onto the metallic gate 20, where the tantalum is subsequently oxidized by an oxidation ambient after sputter deposition is complete.

According to a particular embodiment of the present invention, the gate dielectric 18, metal gate layer 20, and ARC layer 22 all contain the same metallic atom, such as tantalum, which enables formation of all three layers 18, 20, and 22 in the same semiconductor tool or chamber without breaking vacuum. When performing this insitu gate stack formation, the gate dielectric will be formed of tantalum pentoxide which is optionally doped with one or more silicon and/or nitrogen, the metal gate layer is then formed from tantalum nitride or a like tantalum-based material, and the ARC layer is tantalum pentoxide that is also optionally doped with one or more of silicon and/or nitrogen. Accordingly, the present invention provides an advantage of forming all three tantalum-based layers insitu in a single semiconductor tool having one or more processing chambers. This insitu process is unlike the prior art which typically forms a silicon dioxide gate dielectric, a polysilicon gate layer, and a nitride ARC layer, where each layer requires different deposition techniques, source materials/ gases, and semiconductor equipment. This insitu process is especially advantageous since metallic gates will oxidize in an air ambient if removed from a processing tool without a capping layer (e.g., the ARC layer). As is clear from FIG. 1, layers 18, 20, and 22 are all initially blanket deposited.

Figure 2:
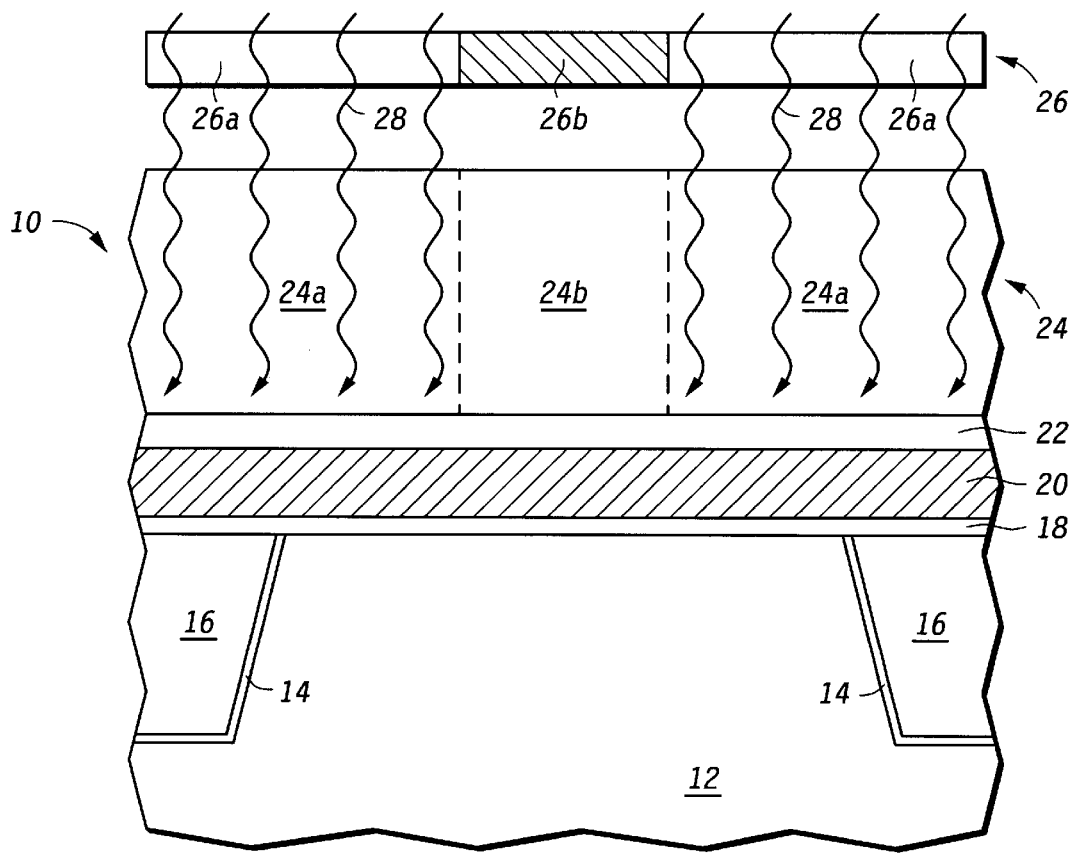
FIG. 2 illustrates another stage in the process of forming a semiconductor device according to an embodiment of the present invention, in which a photoresist is exposed to subsequent patterning of a gate.

In FIG. 2, a next stage in the processing of the semiconductor device 10 is illustrated according to an embodiment of the present invention. As shown, a photoresist layer 24 is spin-coated on top of ARC layer 22. The particular material of the photoresist may be chosen by one of ordinary skill in the art, depending upon the particular exposure wavelength that is utilized, and either positive or negative photoresist may be used herein. In this regard, commercially available photoresists can be used for I-line, deep ultraviolet (DUV), and G-line exposure wavelengths.

Figure 3:
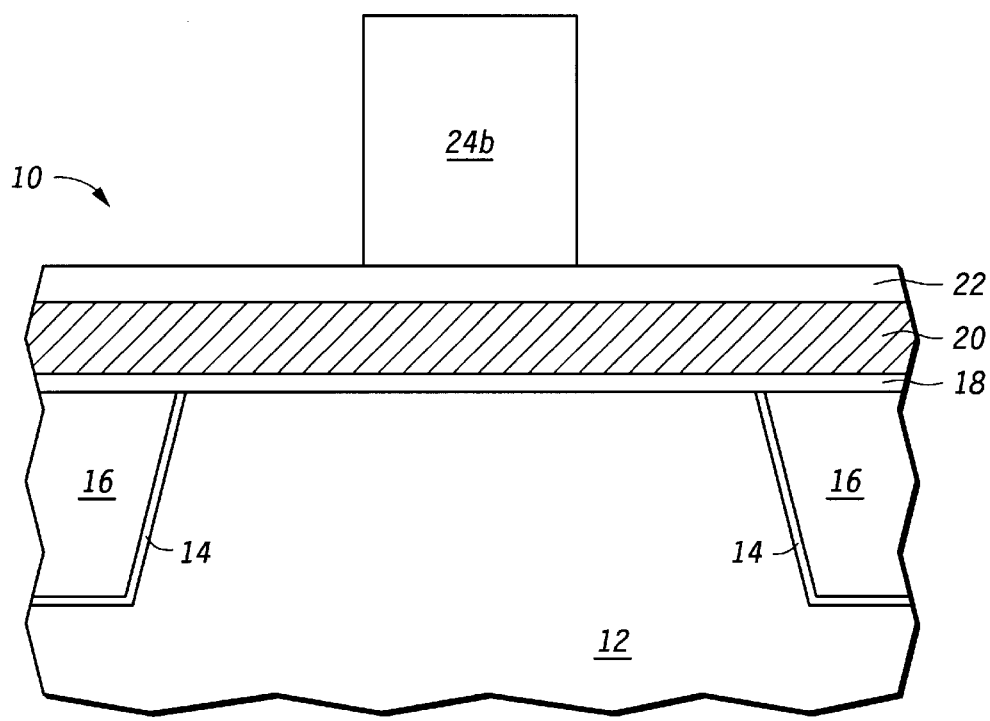
FIG. 3 illustrates another stage in the processing subsequent to exposure and removal of portions of the photoresist.

After formation of photoresist 24, a photolithography mask is positioned over the device 10. The mask 26 has transparent portions 26a, and opaque regions 26b. The wafer is them exposed to deep ultraviolet radiation 28 or like radiation 28 as shown in FIG. 3. The radiation in FIG. 3 is preferably DUV energy having a wavelength of between roughly 246–250 nanometers (nm), or DUV energy having a wavelength of between roughly 191–195 nanometers (nm). Preferably, wavelengths of either 248 nm or 193 nm are used for radiation exposure in FIG. 3, but any wavelength less than or equal to roughly 250 nm may be used herein. The DUV radiation energy passes substantially through transparent region 26a, and is substantially blocked by opaque regions 26b. This selective transmission of the radiation by mask 26 forms exposed photoresist potions 24a and unexposed photoresist 26b. In the illustrated embodiment of FIG. 2, the unexposed photoresist 24b will be subsequently used to define a geometric gate configuration of the transistor metallic gate electrode. Following exposure, the photoresist 24 is chemically developed, thereby removing exposed photoresist portions 24a and leaving behind unexposed photoresist 24b, as shown in FIG. 3. Unexposed photoresist portions 24b remains in place during subsequent etching steps as shown in FIGS. 4 and 5 whereby the gate stack is defined.

Figure 4:
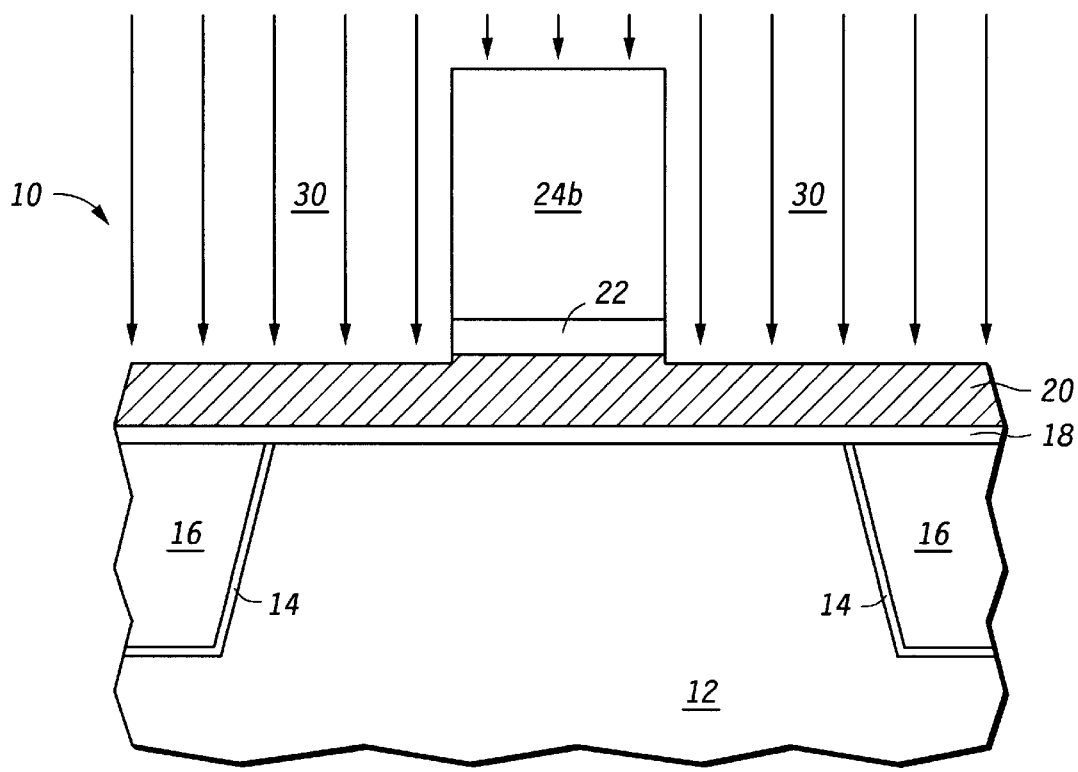
FIGS. 4 and 5 illustrate first and second etching steps for removal of portions of the ARC layer, as well as portions of the metal gate layer.

In FIG. 4, a reactive ion etch or plasma etch ambient 30 is used to continue processing of the device 10. In FIG. 4, the device 10 is exposed to a fluorine-containing etch environment 30, such as $CF_4$. The $CF_4$ may be accompanied by another etch agent such as $CHF_3$ or may be accompanied by an inert carrier gas such as argon (Ar). This particular environment is effective in removing exposed portions of ARC layer 22 with acceptable levels of resist erosion. The exposure to the fluorine-based chemistry is FIG. 4 may be a timed etch or may be endpointed by optically monitoring of the present of oxygen within the etch chamber. With a timed etch, the etch automatically expires once the end time is obtained, whereby the time is calculated to be enough etch time to adequately etch entirely through the exposed regions 22. With the optical endpoint embodiment, the fluorine etch is terminated when the monitored oxygen level indicates that all of the tantalum pentoxide has been effectively removed. The endpoint time of each wafer or each batch of wafers may be different from each other, and therefore the end etch time especially optimized for deposition thickness variations and topography when using optical etch plasma endpointing.

Figure 5:
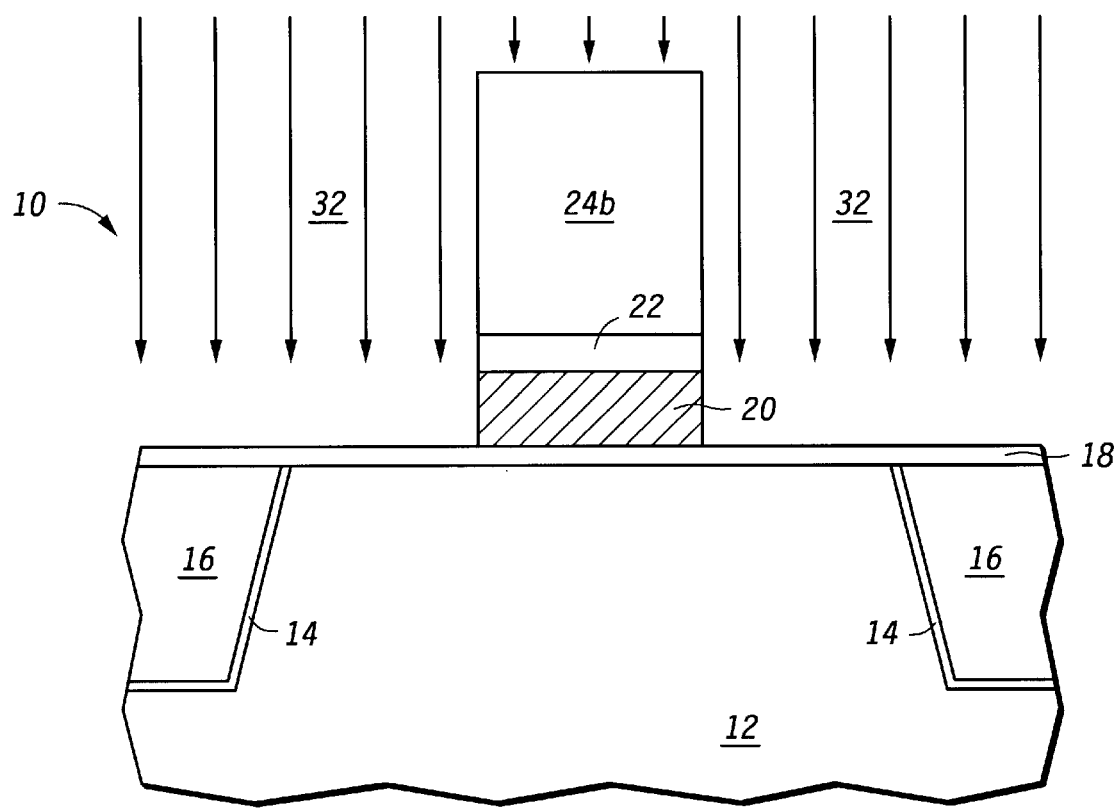
Figure 6:
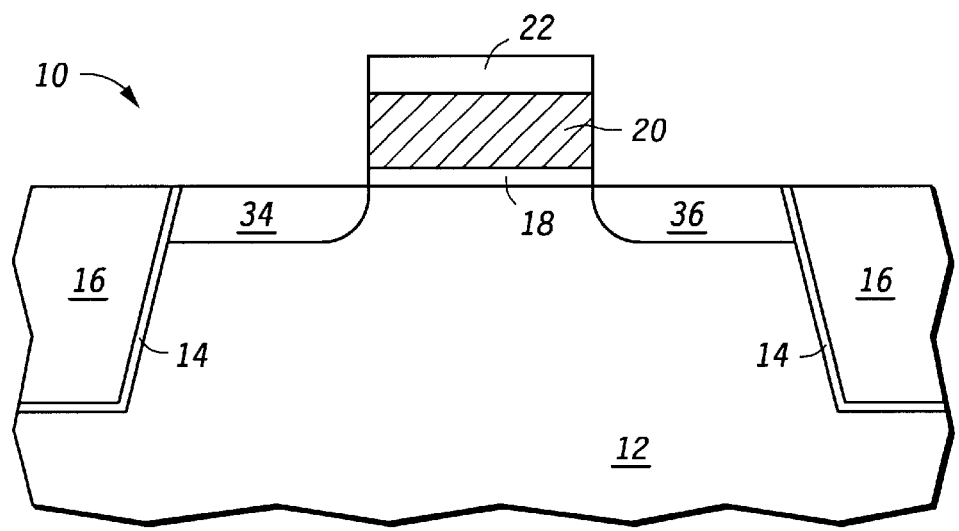
FIG. 6 illustrates a semiconductor device according to an embodiment of the present invention, after patterning of the gate has been completed.

After ending the fluorine-based etch, the etch environment is changed to a second etch environment 32 in FIG. 5. Etch environment 32 is a chlorine-containing etch ambient (e.g., $Cl_2$), which may also contain HBr. Either or both of the fluorine and chlorine etch steps may be carried out by reactive ion etching (RIE) or by similar processing such as plasma etching. The second chlorine etch step may also be a timed etch or may be optically endpointed based upon optical tantalum and/or oxygen monitoring. Although not shown specifically in FIGS. 4–5, a third etch step is carried out after the second chlorine etch step to remove exposed portions of gate dielectric 18. This third etch step removes the layer 18 by using another fluorine-based RIE process (the removal of layer 18 is shown in FIG. 6). In this regard, the same etch chemistry may be used to remove portions of gate dielectric 18 as used with respect to ARC layer 22, provided that ARC layer 22 and gate dielectric 18 are formed of the same material, such as $Ta_2O_5$.

Following the etching steps of FIGS. 4–5, the unexposed photoresist 24b is removed by an oxygen ashing process or a like photoresist removal process. Once the photoresist is removed, a completed gate stack remains, as shown in FIG. 6. The semiconductor device 10 shown in FIG. 6 is then ion implanted to form source and drain electrodes 34 and 36 that are self-aligned to the gate electrode. In other embodiments, the source and drain electrodes may be formed in a non-self-aligned manner. After the formation of source and drain regions 34 and 36, conventional semiconductor processing continues until the device is finally passivated and/or optionally packaged into an integrated circuit (IC) form.

According to embodiments of the present invention, an ARC layer is provided that effectively adheres to a metallic gate layer. The ARC taught herein has good absorptive properties of the energy that is used to expose the photoresist. In this regard, the ARC layer, according to the present invention, has low radiation reflectivity in the DUV range, and accordingly has good absorptive properties. Indeed, the present inventors have confirmed very low reflectivity for $Ta_2O_5$ when placed on TiN, W, W-Si, and Cu gate electrodes. More particularly, the ARC layer reflects less than 5% of the exposed lithographic radiation, and preferably, less than 2% of the radiation in the DUV range, including both the 248 nm and 193 nm wavelengths. This reflection may be controlled by controlling the CVD thickness of the final ARC layer. In addition, the tantalum pentoxide or $M_xSi_yO_zN_t$ (e.g., $TaSi_yO_zN_t$) ARC material of the present invention has relatively low stress as compared with conventional ARC layers, such as silicon nitride. In addition, the present material may be deposited at relatively low temperatures, such as 400 degrees Celsius, utilizing low-pressure vapor deposition (LPCVD) techniques. Glue layers may not be needed thereby improving conductivity of the gate stack and decreasing process complexity.

Although the invention has been described and illustrated with reference to specific embodiments, it is not intended that the invention be limited to those illustrative embodiments. Those skilled in the art will recognize that modifications and variations may be made without departing from the spirit and scope of the invention. Therefore, it is intended that this invention encompass all of the variations and modifications as fall within the scope of the appended claims.

What is claimed is:

1. An electrical device comprising:

a substrate;

a source electrode and a drain electrode within the substrate, the drain electrode being separated from the source electrode by a channel region;

a metallic gate dielectric layer overlying the channel region;

a metallic gate electrode overlying the metallic gate dielectric layer; and a metallic anti-reflective coating (ARC) layer overlying the metallic gate electrode, the ARC layer comprising both tantalum atoms and oxygen atoms and one or more of silicon atoms and nitrogen atoms.

2. The electrical device of claim 1 wherein the metallic gate electrode is a layer of tantalum nitride.

3. The electrical device of claim 1 wherein the metallic gate dielectric layer is tantalum pentoxide.

4. The electrical device of claim 1 wherein the ARC layer is formed having a thickness of less than or equal to approximately 250 angstroms.

5. The electrical device of claim 1 wherein the metallic ARC layer has an extinction coefficient $k \geq 0.2$.

6. The electrical device of claim 1 wherein the metallic gate electrode forms a gate electrode of an MOS transistor wherein the MOS transistor is isolated by trench isolation within the substrate.

7. The electrical device of claim 1 wherein a width of the metallic gate electrode is less than or equal to 0.25 microns.

8. An electrical device comprising:

a substrate;

a source electrode and a drain electrode within the substrate, the drain electrode being separated from the source electrode by a channel region;

a metallic gate dielectric layer overlying the channel region;

a metallic gate electrode overlying the metallic gate dielectric layer; and a metallic anti-reflective coating (ARC) layer overlying the metallic gate electrode, the ARC layer comprising tantalum atoms, silicon atoms, nitrogen atoms and oxygen atoms.

* * * * *

UNITED STATES PATENT AND TRADEMARK OFFICE
CERTIFICATE OF CORRECTION

PATENT NO. : 6,294,820 B1
DATED : September 25, 2001
INVENTOR(S) : Kevin Lucas et al.

It is certified that error appears in the above-identified patent and that said Letters Patent is hereby corrected as shown below:

<u>Title page,</u>
Item [54], in title after "OXIDE" add -- SEMICONDUCTOR --.

Signed and Sealed this

Fourth Day of June, 2002

Attest:

JAMES E. ROGAN
Attesting Officer  Director of the United States Patent and Trademark Office